(12) United States Patent
Herslow et al.

(10) Patent No.: US 11,301,744 B2
(45) Date of Patent: *Apr. 12, 2022

(54) METAL SMART CARD WITH DUAL INTERFACE CAPABILITY

(71) Applicant: CompoSecure, LLC, Somerset, NJ (US)

(72) Inventors: John Herslow, Bridgewater, NJ (US); Adam Lowe, Somerset, NJ (US); Luis Dasilva, Bridgewater, NJ (US); Brian Nester, Hillsborough, NJ (US)

(73) Assignee: Composecure, LLC, Somerset, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/935,948

(22) Filed: Jul. 22, 2020

(65) Prior Publication Data

US 2020/0364532 A1 Nov. 19, 2020

Related U.S. Application Data

(63) Continuation of application No. PCT/US2019/012685, filed on Jan. 8, 2019, which is
(Continued)

(51) Int. Cl.
*G06K 19/077* (2006.01)
*H01L 23/66* (2006.01)
(Continued)

(52) U.S. Cl.
CPC ........ *G06K 19/07794* (2013.01); *H01L 23/66* (2013.01); *H01Q 1/2216* (2013.01);
(Continued)

(58) Field of Classification Search
CPC .......................... G06K 19/07794; G06K 7/08
(Continued)

(56) References Cited

U.S. PATENT DOCUMENTS 6,016,432 A 1/2000 Stein
7,744,005 B2 6/2010 Yin
(Continued)

FOREIGN PATENT DOCUMENTS

CN 104471791 A 3/2015
JP 2009157666 A 7/2009
(Continued)

OTHER PUBLICATIONS

Chinese Office Action for Chinese Application No. 201580030396.7, dated Dec. 17, 2018, with partial translation, 22 pages.
(Continued)

*Primary Examiner* — Allyson N Trail
(74) *Attorney, Agent, or Firm* — Ratner Prestia

(57) ABSTRACT

A transaction card comprising a metal layer. A first cut out region in a first surface of said metal layer has a depth less than the thickness of the metal layer, and a first portion of an integrated circuit (IC) module is secured therein. A second cut out region extends from the first cut out region to the second surface of said metal layer and defines a non-RF-impeding volume having a perimeter greater than the perimeter of the first cut out region. One or more additional layers are stacked on the second surface of the metal layer, and a channel extends between one of the stacked layers and the IC module.

24 Claims, 10 Drawing Sheets

Related U.S. Application Data a continuation of application No. 15/976,612, filed on May 10, 2018, now Pat. No. 10,318,859, which is a continuation-in-part of application No. 15/742,813, filed as application No. PCT/US2015/039535 on Jul. 8, 2015, now Pat. No. 10,289,944, application No. 16/935,948, filed on Jul. 22, 2020, which is a continuation-in-part of application No. 16/739,211, filed on Jan. 10, 2020, now Pat. No. 10,748,049, which is a continuation of application No. 16/367,595, filed on Mar. 28, 2019, now Pat. No. 10,534,990, which is a continuation of application No. 15/742,813, filed on Jan. 8, 2018, now Pat. No. 10,289,944.

(51) Int. Cl.
*H01Q 1/38* (2006.01)
*H01Q 1/22* (2006.01)

(52) U.S. Cl.
CPC .............. *H01Q 1/2225* (2013.01); *H01Q 1/38* (2013.01); *H01L 2223/6677* (2013.01)

(58) Field of Classification Search
USPC ........................................................ 235/492
See application file for complete search history.

(56) References Cited

U.S. PATENT DOCUMENTS

| | | |
|---|---|---|
| 8,393,547 B2 | 3/2013 | Kiekhaefer et al. |
| 9,251,458 B2 | 2/2016 | Finn et al. |
| 9,390,366 B1 | 7/2016 | Herslow et al. |
| 10,289,944 B2 | 5/2019 | Herslow et al. |
| 10,318,859 B2 | 6/2019 | Lowe et al. |
| 10,339,434 B2 | 7/2019 | Cox |
| 2001/0012682 A1 | 8/2001 | Kayanakis et al. |
| 2005/0245001 A1 | 11/2005 | Hyvonen et al. |
| 2006/0102729 A1 | 5/2006 | Gandel et al. |
| 2008/0061148 A1 | 3/2008 | Tanner |
| 2012/0074233 A1 | 3/2012 | Finn et al. |
| 2012/0249306 A1 | 10/2012 | Tada |
| 2013/0126622 A1 | 5/2013 | Finn |
| 2014/0307405 A1 | 10/2014 | Vogt |
| 2015/0021403 A1 | 1/2015 | Finn et al. |
| 2015/0108222 A1 | 4/2015 | Shimizu et al. |
| 2015/0206047 A1 | 7/2015 | Herslow et al. |
| 2015/0339564 A1 | 11/2015 | Herslow et al. |
| 2016/0203399 A1 | 7/2016 | Cox |
| 2016/0283838 A1 | 9/2016 | Ojster |
| 2017/0134104 A1 | 5/2017 | Sinisalo et al. |
| 2017/0262749 A1 | 9/2017 | Cox |
| 2019/0156994 A1 | 5/2019 | Cox |
| 2019/0197381 A1 | 6/2019 | Cox |
| 2019/0204812 A1 | 7/2019 | Cox |
| 2019/0206161 A1 | 7/2019 | Cox |
| 2019/0279065 A1 | 9/2019 | Cox |

FOREIGN PATENT DOCUMENTS

| | | |
|---|---|---|
| JP | 2017524171 A | 8/2017 |
| WO | 2013110625 A1 | 8/2013 |
| WO | 2014113765 A1 | 7/2014 |

OTHER PUBLICATIONS

European Communication Pursuant to Article 94(3) for European Application No. 15 888 724.0, dated Sep. 10, 2019, 3 pages.
Extended European Search Report for European Application No. 15 888 724.0, dated Feb. 2, 2018, 8 pages.
International Preliminary Report on Patentability for International Application No. PCT/US2015/039535, dated Jan. 9, 2018, 8 pages.
International Preliminary Report on Patentability for International Application No. PCT/US2019/012685, dated Jul. 14, 2020, 12 pages.
International Search Report and Written Opinion for International Application No. PCT/US2015/039535, dated Oct. 5, 2015, 8 pages.
International Search Report and Written Opinion for International Application No. PCT/US2019/012685, dated Mar. 26, 2019, 12 pages.
New Zealand Examination Report for New Zealand Application No. 725249, dated Aug. 10, 2018, 6 pages.
Non Final Office Action for U.S. Appl. No. 15/742,813, dated Aug. 31, 2018, 13 pages.
Non Final Office Action for U.S. Appl. No. 15/976,612, dated Aug. 27, 2018, 11 pages.
Entire patent prosecution history of U.S. Appl. No. 14/793,963, filed Mar. 16, 2016, entitled, "Metal Smart Card With Dual Interface Capability."
Entire patent prosecution history of U.S. Appl. No. 15/742,813, filed Jan. 8, 2018, entitled, "Metal Smart Card With Dual Interface Capability."
Entire patent prosecution history of U.S. Appl. No. 16/367,595, filed Mar. 28, 2019, entitled, "Metal Smart Card With Dual Interface Capability."
Entire patent prosecution history of U.S. Appl. No. 16/739,211, filed Jan. 10, 2020, entitled, "Metal Smart Card With Dual Interface Capability."
Entire patent prosecution history of U.S. Appl. No. 15/976,612, filed May 10, 2019, entitled, "Metal Smart Card With Dual Interface Capability."
Indian Examination Report for Indian Application No. 201617035040, dated Dec. 14, 2020 with translation, 6 pages.
Extended European Search Report for European Application No. 20183467.8, dated Dec. 18, 2020, 9 pages.
United Arab Emirates Examination Report for Application No. P6000301/2017 dated Feb. 8, 2021, 7 pages.
United Arab Emirates Search Report for Application No. P6000301/2017, dated Feb. 8, 2021, 7 pages.
Australian Examination Report for Australian Application No. 2019205433, dated Feb. 11, 2021, 3 pages.
Singapore Written Opinion for Singapore Application No. 11202011081W, dated Aug. 16, 2021, 5 pages.
Japanese Notice of Reasons for Rejection for Japanese Application No. 2020-563599, dated Jun. 22, 2021 with translation, 8 pages.

STEP 6

STEP 7A

STEP 7B

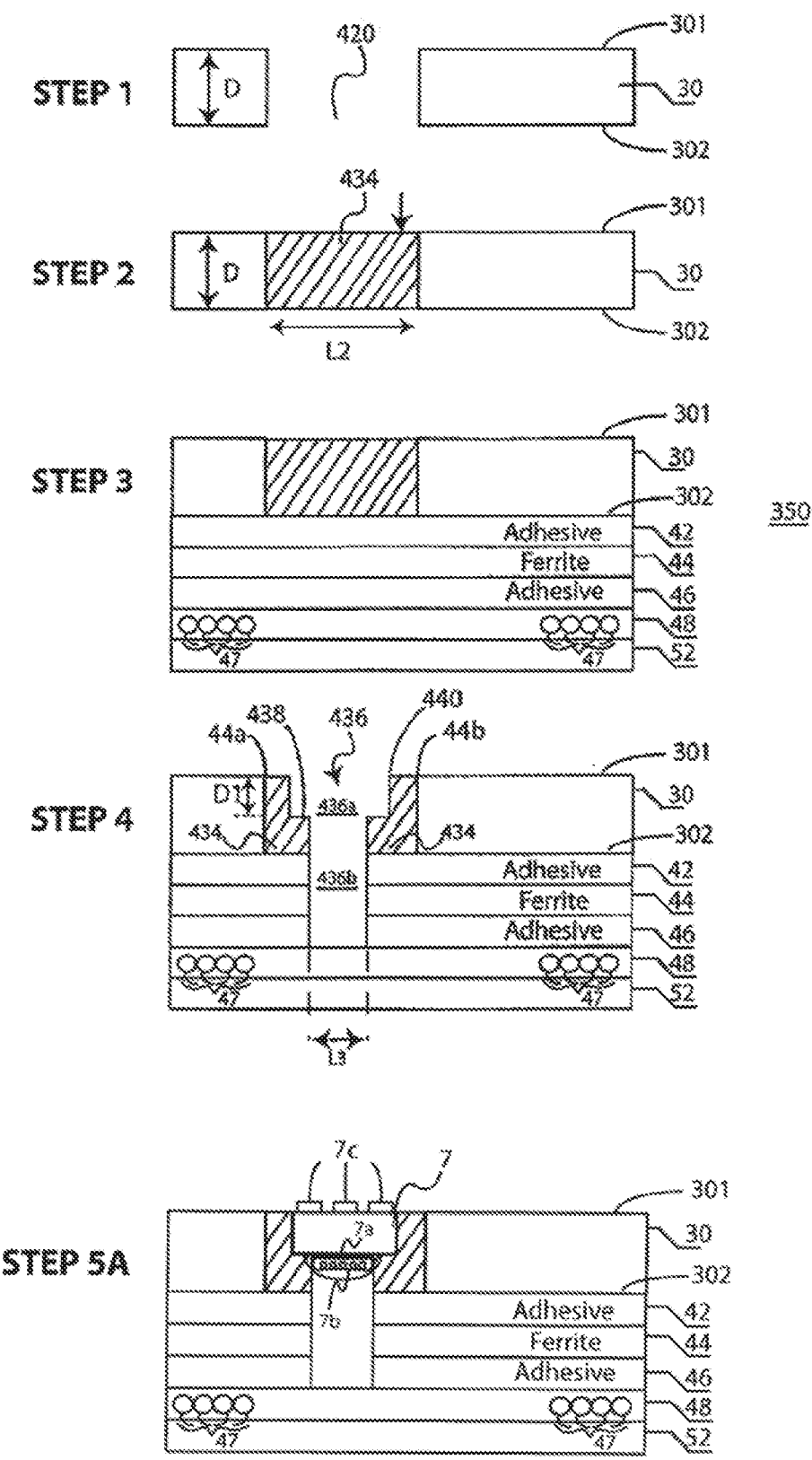

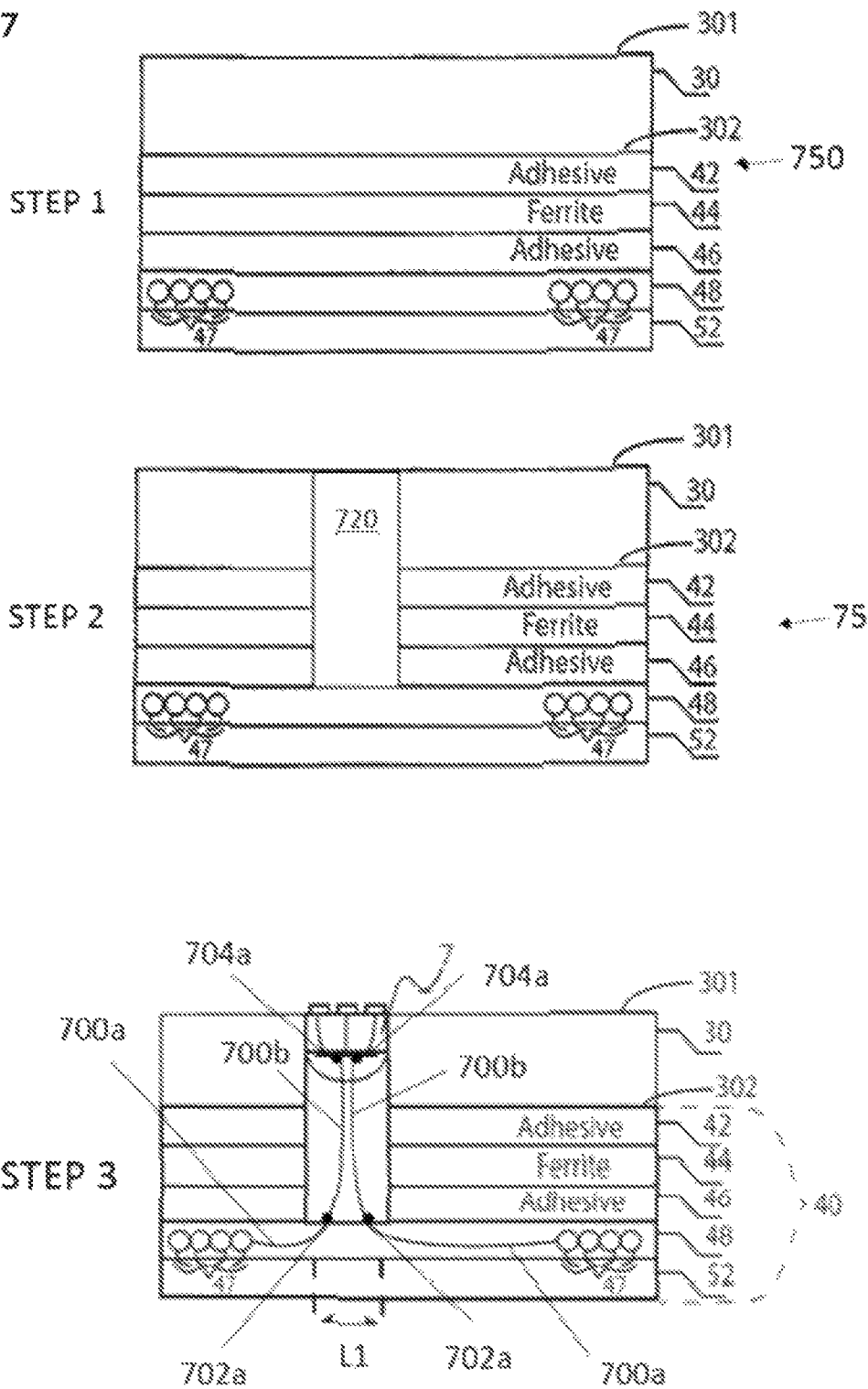

FIG. 7 cont.
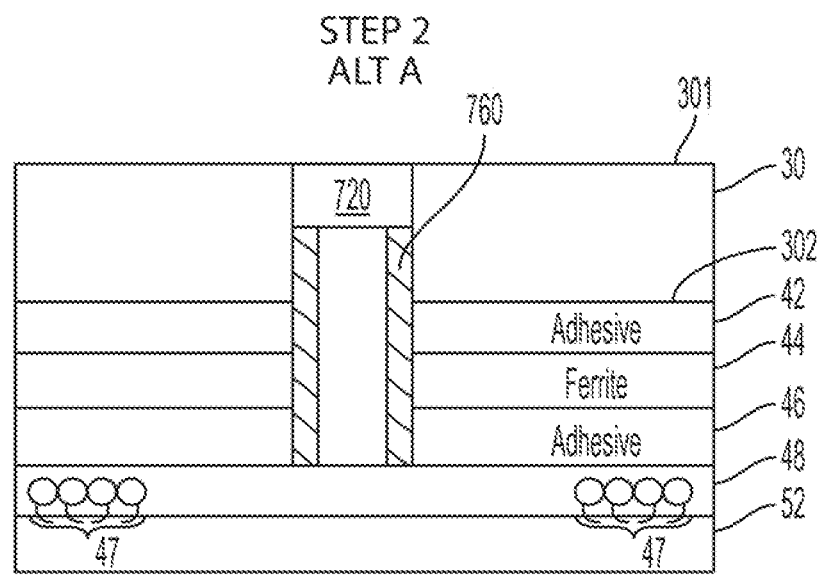
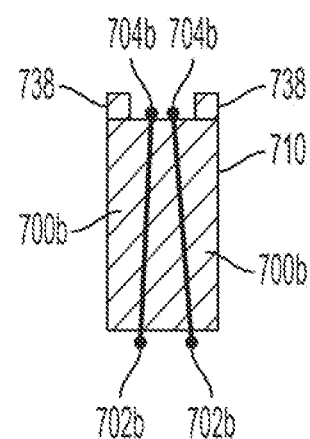
FIG. 8

METAL SMART CARD WITH DUAL INTERFACE CAPABILITY

CROSS REFERENCE TO RELATED APPLICATIONS

This application is a continuation of PCT International Application No. PCT/US 2019/012685, filed Jan. 8, 2019, titled DUAL INTERFACE METAL SMART CARD WITH BOOSTER ANTENNA, which claims priority from U.S. application Ser. No. 15/976,612, filed May 10, 2018 (status: granted as U.S. Pat. No. 10,318,859), which is a continuation-in-part of U.S. application Ser. No. 15/742,813, titled METAL SMART CARD WITH DUAL INTERFACE CAPABILITY, filed Jan. 8, 2018 (status: granted as U.S. Pat. No. 10,289,944), which is a U.S. national phase application of PCT International Application No. PCT/US 2015/039535, filed Jul. 8, 2015. This application is also continuation-in-part of U.S. application Ser. No. 16/739,211, filed Jan. 10, 2020 (status: allowed), which is a continuation of U.S. application Ser. No. 16/367,595, filed Mar. 28, 2019 (status: granted as U.S. Pat. No. 10,534,990 on Jan. 14, 2020), which is a continuation of U.S. application Ser. No. 15/742,813. All of the foregoing are incorporated by reference herein.

BACKGROUND OF THE INVENTION

Smart cards are highly desirable and are in wide use, including: in payment and ticketing applications, such as mass transit and motorway tolls; in personal identification and entitlement schemes on regional, national, and international levels; in citizen cards; in drivers' licenses; in patient card schemes; and in biometric passports to enhance security for international travel.

A smart card is a card that includes embedded electronic circuitry such as an integrated circuit (IC) chip that connects or couples to a card reader with direct physical contact and/or with a remote contactless radio frequency interface. There are generally three categories of smart cards referred to herein as (1) contact, (2) contactless and (3) dual interface.

A "contact" smart card includes an IC chip connected to a conductive contact plate on which are mounted a number of physical contact pads (typically gold plated) located generally on the top surface of the card. A contact smart card is inserted into a contact type smart card reader and transmits commands, data, and card status over the physical contact pads.

A "contactless" smartcard contains an IC chip and a card antenna and is configured for coupling of RF signals between the smart card's IC chip and the antenna of a card reader. This permits wireless (e.g., RF) communication between the card and a card reader with no direct electrical contact between the card and the card reader. A contactless smart card requires only close proximity to a reader. Both the reader and the smart card have antennae, and the two communicate using radio frequencies (RF) over a contactless link. Most contactless cards also derive power for the internal chip from electromagnetic signals emitted by the card reader. The range of operation may vary from less than an inch to several inches.

A "dual-interface" smart card has, typically, a single IC chip (but could have two) and includes both contact and contactless interfaces. With dual-interface cards, it is possible to access the IC chip(s) using a contact and/or a contactless interface.

It has also become very desirable and fashionable to make cards with one or more metal layers. A metal layer provides a desirable weight and a decorative pattern and/or reflective surface enhancing the card's appearance and aesthetic value. This is especially desirable for use by high-end customers. It is therefore desirable to make dual interface (contacts and contactless) smart cards having a metal layer.

However, several problems arise in the making of dual interface ("contactless" and "contact") smart cards with a metal layer because of conflicting requirements. By way of example, to construct a dual interface smart card, the contact pads associated with the IC chip will be located along an external surface (top or bottom, but normally top) of the card to make contact with a contact card reader and the IC chip will generally be located near the top surface. However, any metal layer in the card interferes with radio-frequency (RF) communication signals (e.g., attenuates) between the card and the reader, and this may render the contactless smart card useless. So, a dual interface smart card with a metal layer ideally minimizes RF interference with respect to the IC chip. Compounding the problem is the desire for the dual interface metal smart card to have a highly sophisticated appearance. Due to the prestige and aesthetic aspect of these cards, the contact pads desirably have an aesthetically pleasing interface with the card surface.

SUMMARY OF THE INVENTION

One aspect of the invention is a card having a card length, a card width, and a card thickness. The card comprises a metal layer having a top surface and a bottom surface extending parallel to each other. An opening in said metal layer (a) extends from the top surface to the bottom surface or (b) is defined by a first region cut out region in the top surface of the metal layer and a second cut out region extending from the bottom surface of the metal layer and extending vertically below the first cut out region and generally in a symmetrical manner with respect to the first cut out region. An integrated circuit (IC) module having a depth $D1$, a first area, and a first perimeter is disposed within the opening or the first cut out region. The IC module has contacts positioned along the top surface of the metal layer and is configured to communicate using RF transmission to enable contactless operation. A plug formed of non-RF-impeding material is disposed within the opening or the second cut out region, the plug having a second area and a second perimeter equal to or greater than the first area and the first perimeter, respectively. A ferrite layer is disposed below the metal layer, and a vertical hole in the plug and extending through the ferrite layer has a third area and a third perimeter less than the first area and the first perimeter, respectively. A booster antenna is attached to the ferrite layer for enhancing RF transmission with the IC module.

The first cut out region may have dimensions nominally equal to, but slightly greater than $D1$, the first area, and the first perimeter, to facilitate a snug fit of the IC module disposed within the first cut out region. The second cut out region may have a second area and second perimeter greater than the first area and first perimeter, respectively, extending vertically until a distance $D1$ from the top surface, with the plug disposed within the second cut out region. The metal layer may have a thickness $D$ greater than $D1$, and the opening in the metal layer may extend for a full thickness of the metal layer in which is located the IC module mounted on the plug extending between the top and bottom surfaces of the metal layer.

The second area and the second perimeter of the opening in the metal layer may be respectively greater than the first area and the first perimeter, and the plug may be attached to the metal layer and may fill the opening within the metal layer. The plug may have a first cut out region having an area and a perimeter nominally equal to but slightly greater than the first area and the first perimeter, respectively. The plug may extend for a depth nominally equal to but slightly greater than D1 below the top surface for accommodating the IC module with a snug fit. The plug may have a second region below the first region which extends until the bottom surface of the metal layer. A masking layer may be disposed over the top metal surface and any exposed portion of the plug.

The booster antenna may be configured to inductively couple to the IC module or may be physically connected to the IC module.

A method of making one embodiment of a card as described herein may comprise the steps of selecting the metal layer, cutting out the second cut out region in the metal layer starting from the bottom surface of the metal layer, and securely attaching the plug within the second cut out region. The plug is designed to fit in and fill the second cut out region. The first cut out region is cut in said top surface of the metal layer overlying said second cut out region, and disposed symmetrically with respect to the second cut out region. The IC module is inserted and securely attached within the first cut out region with the contacts of the IC module positioned along the same horizontal plane as the top surface of the metal layer. The ferrite layer is attached to the bottom surface of the metal layer, and the booster antenna layer is attached to the ferrite layer. The vertical hole is then formed in the plug and the ferrite layer. The method may further comprise laminating the metal layer, the ferrite layer and the booster antenna layer. The method may further include the step of physically connecting the booster antenna to the IC module.

A method of making another embodiment a card as described herein may comprise the steps of selecting the metal layer, forming the opening, securely attaching the plug within the opening; and inserting and securing attaching the IC module within the plug first cut out region. The ferrite layer is attached to the bottom surface of the metal layer, and the booster antenna layer is attached to the ferrite layer; and the vertical hole is formed in the plug and the ferrite layer. The method may further comprise forming a masking layer over the top metal surface and any exposed portion of the plug. The method may comprise laminating the metal layer, the ferrite layer and the booster antenna layer.

Another aspect of the invention comprises a metal smart card with dual interface capability comprising a metal layer of thickness D having a top surface and a bottom surface extending parallel to each other, the top surface defining a horizontal plane. The card includes an integrated circuit (IC) module having a top region with contacts configured for physical contact with a card reader. The IC module is also configured for contactless radio frequency (RF) communication with a card reader, and has a first periphery, a first area, and a thickness D1, wherein D1 is less than D. A plug of non-RF-impeding material has a second periphery and a second area equal to or greater than the first periphery and a first area, respectively. An opening in the metal layer extends for a full thickness of the metal layer. The IC module is mounted on the plug disposed in the opening, the IC module and the plug extending in the vertical direction between the top and bottom surfaces of the metal layer with the contacts of the IC module positioned along the same horizontal plane as the top surface of the metal layer. The opening in the metal layer has a first region at and just below the top surface for accommodating the IC module and a second region below the first region which extends until the bottom surface of the metal layer. The opening in the first region has lateral dimensions nominally equal to but slightly greater than the first area and the fist periphery for a depth nominally equal to but slightly greater than D1. The second region has a second area and a second periphery for a depth of a remaining thickness of the card beneath the first region. The IC module fits in and fills the opening in the first region and the plug fits in and fills the opening in the second region. The second area and the second periphery are respectively greater than the first area and the first periphery. A masking layer is disposed over the top metal surface and any exposed portion of the plug. A ferrite layer is disposed below the metal layer. A vertical hole in the plug extends through the ferrite layer. The vertical hole has a third area and a third periphery less than the first area and the first periphery, respectively. A booster antenna is attached to the ferrite layer for enhancing RF transmission with the IC module. The booster antenna may be configured to inductively couple to the IC module or may be physically connected to the IC module.

Still another aspect of the invention comprises a card comprising a metal layer having a top surface and a bottom surface extending parallel to each other. A first region cut out in the top surface of the metal layer has a first depth, a first perimeter and a first area. An integrated circuit (IC) module is snugly secured within the first cut out region. The IC module has contacts positioned along the top surface of the metal layer and is configured to communicate using RF transmission to enable contactless operation. A second cut out region extends from the bottom surface of the metal layer until the first depth from the top surface. The second cut out region extends vertically below the first cut out region and generally in a symmetrical manner with respect to the first cut out region. The second cut out region has a second area and a second perimeter greater than the first area and the second perimeter. A plug comprising non RF impeding material is snugly secured within the second cut out region. A ferrite layer is disposed below the metal layer. A a vertical hole in the plug extends through the ferrite layer, and has having a third area and a third periphery less than the first area and the first periphery, respectively. A booster antenna is attached to the ferrite layer for enhancing RF transmission with the IC module. The booster antenna may be configured to inductively couple to the IC module or may be physically connected to the IC module.

Still another aspect of the invention comprises a card comprising a metal layer having a top surface and a bottom surface extending parallel to each other, and a thickness extending between the top surface and the bottom surface.

A ferrite layer is disposed below the metal layer. A booster antenna is disposed below the ferrite layer for enhancing RF transmission with the IC module. An opening in the metal layer and the ferrite layer extends to the booster antenna layer. An integrated circuit (IC) module having a first area, a first perimeter, and a first depth that is less than the thickness of the metal layer is disposed within the opening, has contacts positioned along the top surface of the metal layer and is configured to communicate using RF transmission to enable contactless operation. A physical electrical connection between the booster antenna and the IC module extends through the opening. The card may have a non-conductive liner in the opening in the metal layer. The non-conductive liner may comprise a plug of non-conductive material, wherein the plug has a second area and a second perimeter greater than the first area and the first perimeter, respectively. The plug may have the second area and the second perimeter for a depth that extends for a full thickness of the metal layer and further comprises a cut out region in the plug nominally equal to but slightly greater than the first area, the first perimeter, and the first depth for receiving the IC module in the cut-out region. The plug may further have a through-hole extending from the cut-out region for a remaining depth of the plug and connecting to the opening in the ferrite layer. The through-hole in the plug and the opening in the ferrite layer have a third area and a third perimeter less than the first area and the first perimeter, respectively.

The opening may be a stepped opening having a first region nominally equal to but slightly greater than the first area, the first perimeter, and the first depth so as to fit the IC module snugly therein. A second region has the second area and the second perimeter for a depth that extends from the bottom surface of the metal layer for a distance less than a full thickness of the metal layer. The plug is disposed only in the second region, and has a through-hole connecting to the opening in the ferrite layer. The through-hole in the plug and the opening in the ferrite layer have a third area and a third perimeter less than the first area and the first perimeter, respectively.

The opening may have an area and a perimeter that is nominally equal to but slightly greater than the first area and the second area, and the physical electrical connection between the booster antenna and the IC module may comprise a connection module disposed between the booster antenna and the IC module. The booster antenna may have first and second connection nodes and the IC module may have third and fourth connection nodes. The connection module may have mating first and second connection nodes on a first surface thereof and third and fourth connection nodes on a second surface thereof. A first conductive trace connects the first and third nodes and a second conductive trace connects the second and fourth nodes.

Yet another aspect of the invention is a method of making the card embodiment described above, the method comprising the steps of selecting the metal layer, attaching the ferrite layer beneath the metal layer, attaching the booster antenna layer beneath the ferrite layer, forming the opening in the metal layer extending through the ferrite layer to the booster antenna, and inserting and securely attaching said IC module in the opening with the contacts of the IC module positioned along the same horizontal plane as the top surface of the metal layer and the IC module physically connected to the booster antenna layer.

The method may comprise first forming the opening in the metal layer and disposing a plug in at least a portion of the opening in the metal layer, at least a portion of the plug having a second area and a second perimeter greater than the first area and the first perimeter, respectively, and creating a through-hole in the plug and the opening in the ferrite layer, the through-hole in the plug and the opening in the ferrite layer having a third area and a third perimeter less than the first area and the first perimeter, respectively. The method may comprises first forming a bottom portion of the opening in the metal layer for less than a full thickness of the metal layer, the bottom portion having the second area and a second perimeter, and disposing the plug in the bottom portion of the metal layer, then creating through-hole in the plug and the opening in the ferrite layer, the through-hole in the plug and the opening in the ferrite layer having a third area and a third perimeter less than the first area and the first perimeter, respectively. The method may comprise first laminating the metal layer, the ferrite layer beneath the metal layer, and the booster antenna layer together, then forming the opening in the metal layer extending through the ferrite layer to the booster antenna, wherein the opening has an area and a perimeter nominally equal to but slightly greater than the first area and the first perimeter, respectively.

The method may comprise disposing a liner in the opening prior to inserting and securely attaching the IC module in the opening and connecting the IC module to the booster antenna layer. The booster antenna layer may have a plurality of connection nodes and the IC module may have a plurality of connection nodes, wherein the method further comprises disposing a connector in the opening prior to inserting the IC module in the opening, the connector having mating nodes for connecting to the booster antenna connection nodes and the IC module connection nodes.

BRIEF DESCRIPTION OF THE DRAWINGS

The invention will be understood more completely from the following detailed description of presently preferred, but nonetheless illustrative, embodiments in accordance with the present invention, with reference being had to the accompanying drawings, which are not drawn to scale, but in which like reference characters denote like components.

FIG. 7 includes cross sectional diagrams of various processing steps (STEP 1 through STEP 3) to form a card according to another aspect of the invention;

FIG. 8 is a cross sectional diagram of an exemplary connector for use in connection with the embodiment depicted in FIG. 7 STEP 3.

DETAILED DESCRIPTION

Figure 1:
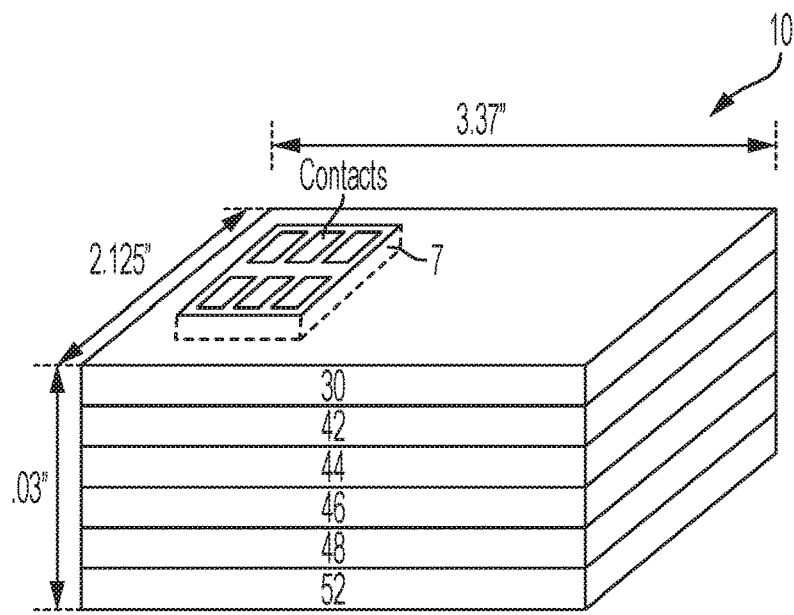
FIG. 1 is a simplified, isometric diagram of a smart card 10 with a metal layer 30, embodying the invention.
Figure 1A:
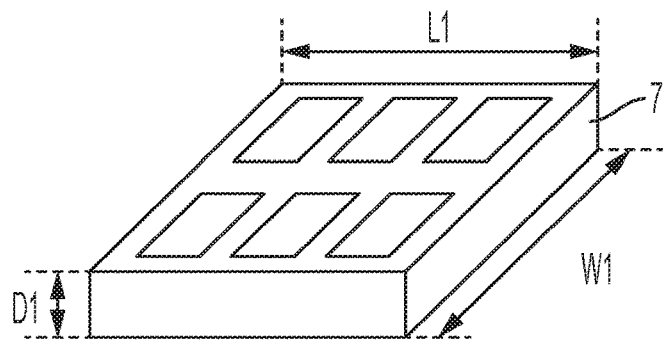
FIG. 1A is a highly simplified, idealized isometric diagram of an integrated circuit (IC) module capable of contactless and contact operation intended for use in making smart cards embodying the invention.

An integrated circuit (IC) module 7 having multiple contacts as shown in FIG. 1A is to be mounted in, and on, a card 10 as shown in FIG. 1 with the top surface of the IC module and its contacts generally flush with the top surface of the card. By way of example it is shown that the length, width and depth of the card may respectively be approximately 3.37 inches by 2.125 inches by 0.03 inches. For purpose of illustration and the discussion to follow, we assume, as shown in FIG. 1A, that the IC module has a depth D1, a length L1 and a width W1. Modules such as IC module 7 are commercially available, for example, from Infineon or NXP. The lateral dimensions of some of these modules were approximately 0.052 inches by 0.47 inches with a depth ranging from 0.005 inches to more than 0.025 inches. These dimensions are purely illustrative and IC modules used to practice the invention may be greater or smaller in size.

Figure 1B:
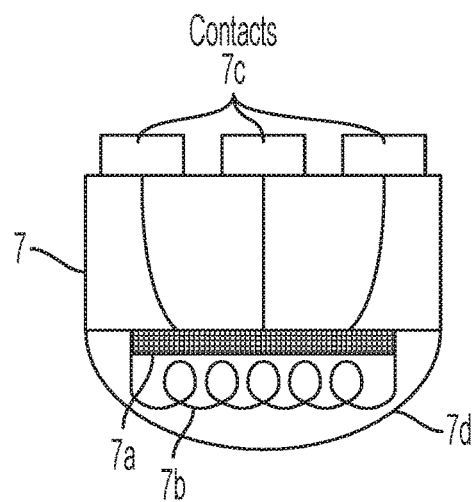
FIG. 1B is a simplified idealized cross sectional diagram of the IC module of FIG. 1A used in the card shown in FIG. 1.

As shown in FIG. 1B, IC module 7 contains an internal microprocessor chip 7a, a chip antenna 7b and a contact pad 7c. Pad 7c may be a conventional multi-contact pad used in contact-type smart cards and is positioned to engage contacts in a contact card reader (not shown) when the smart card is inserted therein. An epoxy blob 7d encapsulates the bottom side of the IC module. The epoxy blob allows the IC module to be easily attached (e.g., by gluing) to an underlying surface. The invention is not limited to any particular method for attachment of the chip to the module, which attachment may, for example, instead be a flip chip connection.

As noted above, one aspect of the invention is directed to the manufacture of a smart metal card having dual interface capability. Preferably, the card also has a top surface free of any bumps or depressions, except for: (a) the IC module and its contacts, and/or (b) any design or texture intentionally formed on the top surface. The card can be made to have a highly aesthetic, smooth and visually pleasing appearance even though the card has dual interface capability (i.e., contact and contactless capability). The contacts of the IC module are located along an exterior surface of the card. Typically, the contacts are located along the top surface of the card; although the contacts may be located along the bottom surface of the card. A cut out (opening) in the metal layer underlies and surrounds the IC module. Ideally, these cut outs (openings) in the metal layer are formed without affecting the smooth, aesthetic, exterior (e.g., top) appearance of the card.

Figure 2:
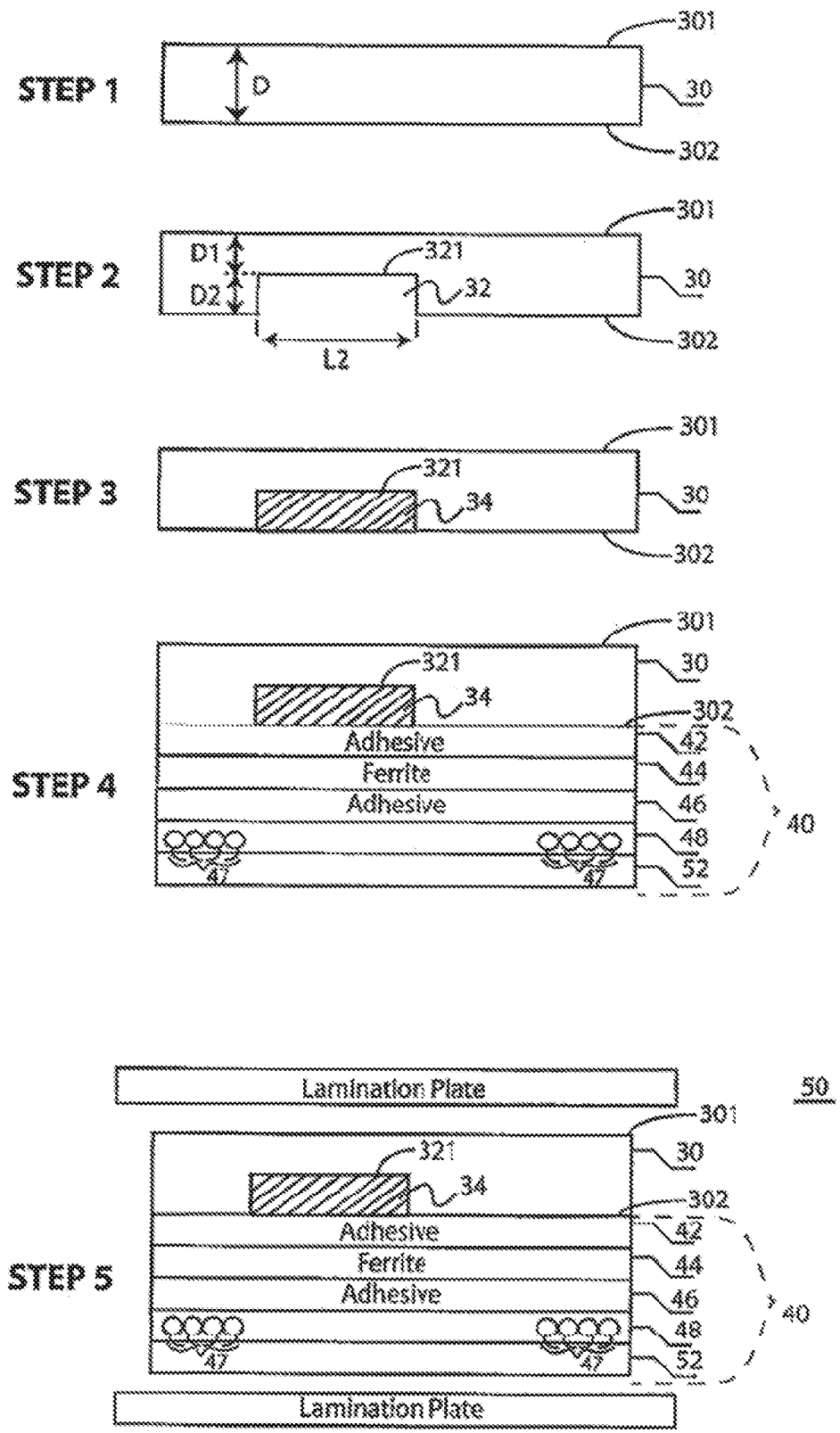
FIG. 2 includes cross sectional diagrams of various processing steps (STEP 1 through STEP 7A or 7B) to form a card embodying the invention.
Figure 2:
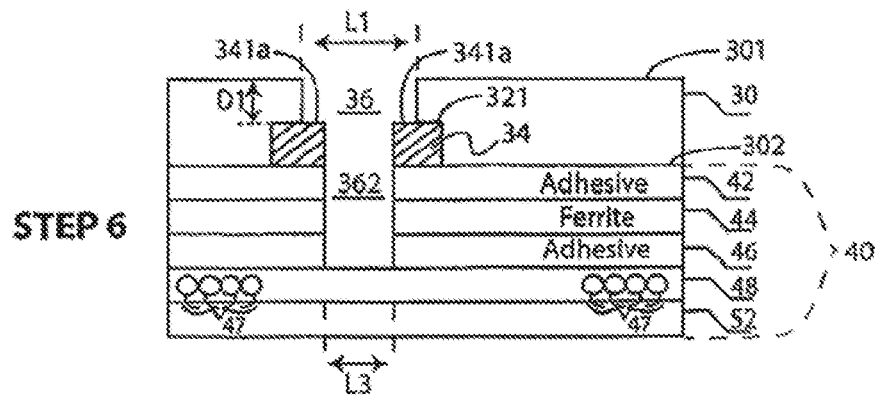
Figure 2:
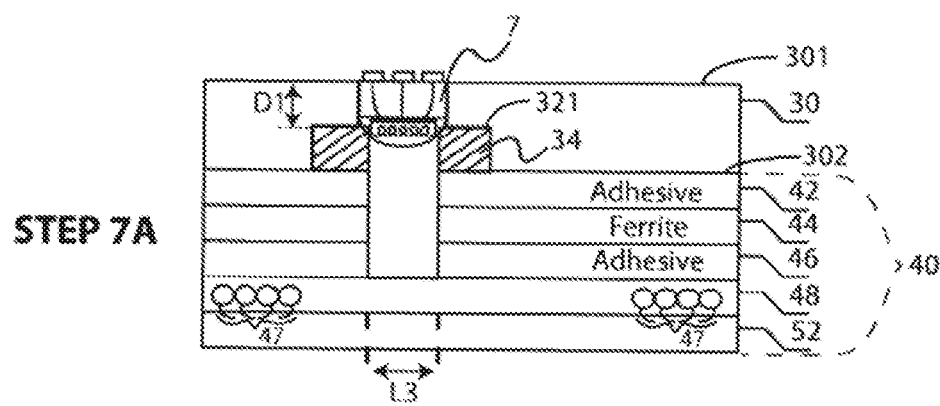
Figure 2:
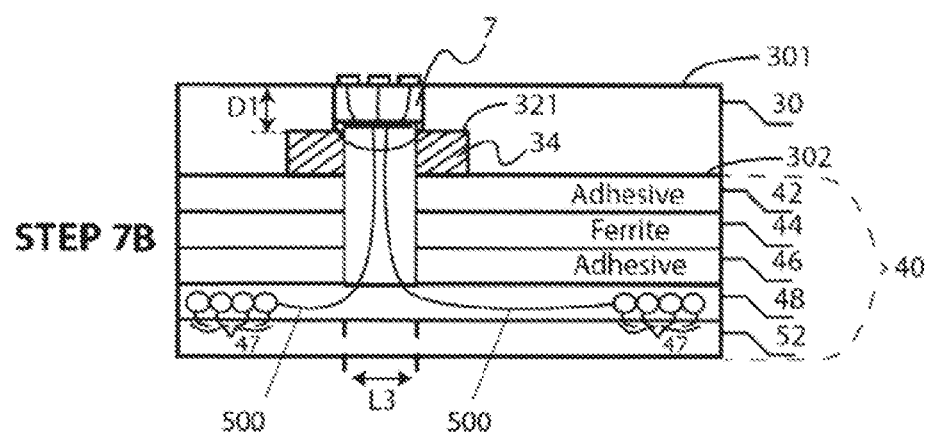

A method of forming a card in accordance with the invention includes the structure and processing steps illustrated in FIG. 2.

STEP 1—A metal layer 30 is selected to serve as the top layer of a card 10 (as shown in step 1 of FIG. 2). The metal layer 30 has a top (front) surface 301 and a bottom (back) surface 302; the front and back surfaces are generally parallel to each other. The thickness (D) of the metal layer 30 may range from less than 0.01 inches to more than 0.02 inches. In one embodiment the metal layer 30 comprises stainless steel and its thickness is 0.0155 inches. Metal layer 30 may, by way of example and not by way of limitation, comprise iron, tantalum, aluminum, brass, copper or any alloy or compound thereof.

STEP 2—A pocket 32 is formed along the underside of layer 30. It may be referred to as a reverse pocket formed starting from the bottom surface of metal layer 30 (as shown in step 2 of FIG. 2). The pocket 32 may be formed in any known manner including, but no limited to: milling, casting, 3D printing, laser cutting, water jet electro-discharge (EDM). The pocket 32 has a top 321 which ends a distance (or thickness) D1 below top surface 301, where D1 is typically equal to (or nearly equal to) the depth of the IC module 7. The depth (thickness) D2 of pocket 32 is then equal to (D-D1) inches. D2 will generally always be set to equal the depth D of the metal layer 30 minus the thickness D1 of the IC module used to form the card. The pocket 32 may be of regular or irregular shape, a rectangular solid or a cylinder whose planar projection in the horizontal plane may be a square, a rectangle or a circle. The lateral dimensions [length (12) and width (W2)] of the pocket 32 can be, respectively, equal to or greater than the lateral dimensions [length L1 and width W1] of the IC module as further discussed below. In the embodiments L2 and W2 are shown to be, respectively, greater than L1 and W1, but that is not a necessary condition.

STEP 3—A plug 34 of any material which does not substantially interfere with RF transmission (e.g., any non-metallic material, or even a material such as tungsten or a composite thereof) is formed or shaped to conform to the dimensions of the milled pocket 32 and is inserted in the pocket to fill the milled (cut out) region (as shown in step 3 of FIG. 2). As discussed below the plug functions to electrically isolate and insulate the IC module from the metal layer and to also physically secure the IC module. The interior of the pocket 32 and/or the exterior of the plug 34 is/are coated with a suitable adhesive (e.g., such as acrylic or acrylic modified polyethylene, cyanoacrylate, silicone elastomer, epoxy) so the plug 34 adheres firmly to the walls of the pocket throughout the processing of the metal layer in the formation of the card. The plug 34 may be made of any material that does not significantly impede radio frequency (RF) transmission, such as a thermoplastic material, such as PET, PVC or other polymer, or a curable resin or epoxy, a ceramic, or even tungsten.

STEP 4—As shown in step 4 of FIG. 2, an adhesive layer 42 is used to attach a ferrite layer 44 to the back surface 302 of layer 30. The ferrite layer 44 is placed below the metal layer 30 to act as a shield (reflector) to prevent/reduce metal layer 30 from interfering with radio frequency radiation to and from the smart card. Ferrite layer 44 decreases the "shorting" effect of metal layer 30 for enabling transmission or reception via antenna 47. Those skilled in the art will appreciate that it would also be possible to form or lay out the ferrite material in a different manner.

Also, an adhesive layer 46 is used to attach a plastic (e.g., PVC) layer 48 which contains and/or on which is mounted a booster antenna 47. Layer 48 may be made of PVC or polyester and may be between 0.001 and 0.015 inches thick. The windings of booster antenna 47 may range from less than 80 microns to more than 120 microns in diameter and may be secured to layer 48 by ultrasonic welding or heating the wire prior to placing it in contact with the plastic layer or by any other suitable process. A layer 52, which includes a signature panel and a magnetic stripe, may be attached to layer 48 before or after lamination. Layers 42, 44, 46, 48 (and possibly 52) may be formed as a sub-assembly 40 and attached to the bottom side 302 of metal layer 30.

STEP 5—The assembly comprising layers 30, 42, 44, 46 and 48 is laminated (as indicated in step 5 of FIG. 2) to form a card assembly 50.

STEP 6—A hole (or opening) 36 is then formed (e.g., by milling) through the metal 30 to a depth D1 from the top surface and, concurrently, a hole 362 is then formed in plug 34, (e.g., by drilling about the center of the plug 34) and through the underlying layers 42, 44 and 46 until layer 48, as shown in step 6 of FIG. 2. The lateral dimensions of the hole 36 formed in the metal layer 30 are designed to correspond to the dimensions L1 and W1 of the IC module 7 so the IC module can be inserted in the hole (opening) 36. The lateral dimensions of the hole 362 formed in the plug 34 will be L3 and W3, where L3 and W3 are less than L1 and W1. So made, plug ledges 341a will provide support for the IC module and keep it at its designed height of D1 below the top card surface.

STEP 7—The IC module may then be snugly inserted and attached to the sides of opening 36 and to top 341a of the plug 34. That is, the IC module may be inserted with tight clearance and glued in place. The smaller hole (opening) 362 formed below hole 36 accommodates the rear (bottom) end of module 7. Hole 362 extends vertically down through ferrite layer 44 and is made sufficiently wide (a) to enable RF signals to pass between antenna 47 and the chip antenna 7b for embodiments using RF coupling between antenna 47 and chip antenna 7b, as shown in STEP 7A, or (b) to enable physical connections 500 between the antenna 47 and the chip antenna, in embodiments with physical connections as shown in STEP 7B.

In embodiments with physical connections, the connections may be in the form known in the art, including but not limited to continuous wires between the wires of the antenna winding and the corresponding wires of the module, or connection points on the antenna layer that mate with a connector constructed to span the distance between the nodes and the connection points on the module, such as is illustrated in FIGS. 7 and 8 and described in more detail herein later. Although in the case of a physical connection, it may not be as beneficial to have a non-RF-impeding material between the chip and the antenna layer, there may still be advantages to having, in particular, a non-metallic material lining the channel. Such materials enable the use of non-insulated connectors 500, if desired. There are multiple ways to form electrical connections between the module and an antenna. The antenna may comprise a wire (e.g. copper or another metal) or a planar antenna. An exemplary planar antenna may be etched or printed, typically in a roll-to-roll fashion. The direct connection to the module may be formed via anisotropic (ACF) tape, conductive adhesive, solder or solder bump methods.

With respect to the operation of the card, booster antenna 47 is designed to capture radio frequency energy generated by an associated card reader (not shown) and to communicate with the card reader. By design, module antenna 7b is sufficiently close to couple inductively with antenna 47 (in inductively coupled embodiments), thereby providing signals from antenna 47 to chip 7a, while keeping the chip electrically isolated from antenna 47. In operation, ferrite layer 44 shields metal layer 30, to make it possible for radio frequency radiation to enter and be emitted from card 10. In operation, ferrite layer 44 shields metal layer 30, to make it possible for radio frequency radiation to enter and be emitted from card 10. Booster antenna 47 is designed to capture radio frequency energy generated by an associated card reader (not shown) and to communicate with the card reader.

As shown in Step 7A of FIG. 2, an IC module 7 which, as shown in FIG. 1B, includes a chip 7a, a chip antenna 7b and a set of contacts 7c is positioned within hole 36. The IC module 7 is glued in place completing the formation of an exemplary card.

Figure 3A:
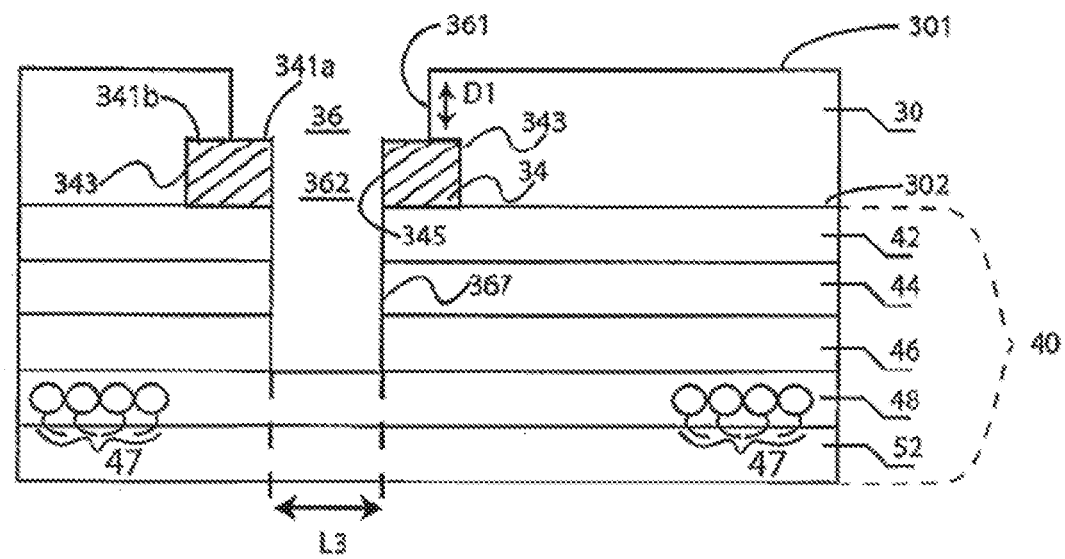
FIG. 3A is a simplified cross sectional diagram of a card being made as shown in step 5 of FIG. 2.
Figure 3B:
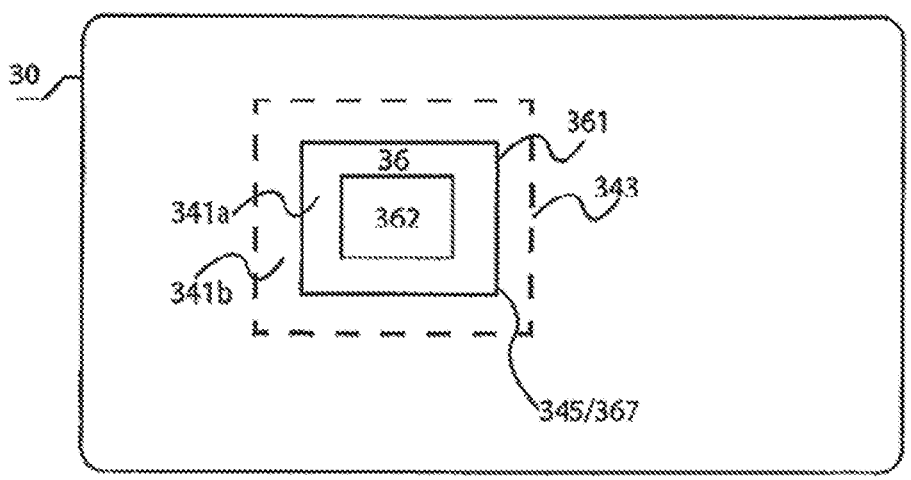
FIG. 3B is a top view of a card being formed as shown in FIG. 3A with a plug (34) and the opening (36) formed in the plug.

To appreciate the appearance of the card as finally formed reference is first made to FIG. 3A (which is essentially a copy of STEP 6 of FIG. 2) and to FIG. 3B. FIG. 3B is a top view of the card being formed showing the openings (36 and 362) formed in the metal and the plug. Note the hole 36 in metal layer 30 will have edge(s) 361 and the hole 362 in the plug and the underlying layers 42, 44, 46 will have edge(s) 345/367. The portion of the plug 34 below region 341b and the outer edge 343 of the plug will not be seen. Hence, outer edge 343 is shown with dashed lines.

Figure 3C:
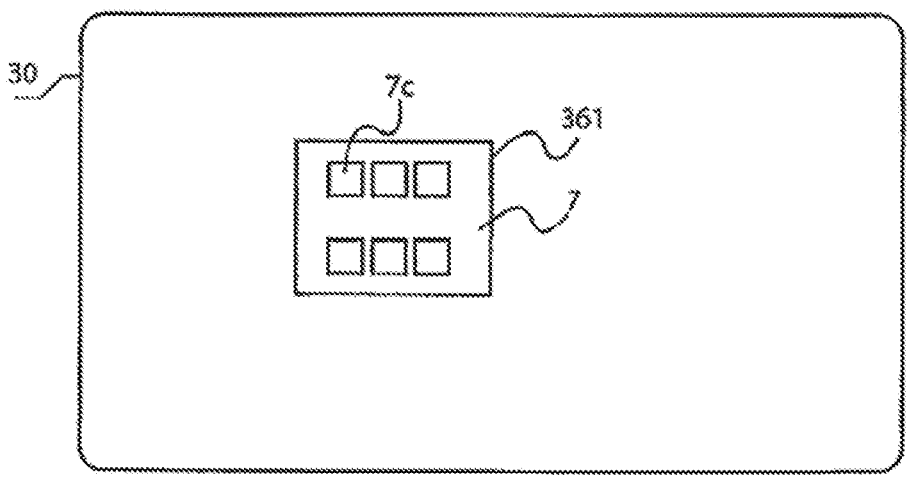
FIG. 3C is a top view of the top layer of a card embodying the invention formed in accordance with the process shown in FIG. 2.

The resultant FIG. 3C is a top view of a card 10 showing the module 7 mounted and inserted in the top of the card. The plug 34 is not seen since it is underneath the metal layer. Thus, the top surface of a card 10 formed in accordance with the process steps shown in FIG. 2 displays a completely smooth unbroken metal surface (except for the contact pad of the IC module). The underlying plug is covered (hidden) by an overlying metal region. Significantly, the card having the desired beautiful physical appearance can function as a wireless (contactless) card or as a contact card.

It should be understood that as described herein with both the chip and the opening for receiving the chip having nominal dimensions L1, W1, that the chip is slightly less than L1, W1 and/or the opening is slightly more than L1, W1, by a commercially acceptable tolerance (e.g. 0.0005-0.002"), such that the chip fits snugly within the hole with the commercially acceptable tolerance. Preferably, however, the gap between the chip and the sides of the opening is minimized (sufficient to prevent shorting between the contacts and the sides of the opening in the metal body, but not substantially more) to provide a "snug" fit, primarily for aesthetic purposes. Thus the term "nominally equal to but slightly greater than" referencing an opening for receiving the IC module refers to an opening that includes only this commercially acceptable tolerance, without more, as would be understood by those of skill in the art from the descriptions herein. Unlike other designs known in the art, a deliberately large gap between the chip and the sides of the opening is not required to provide suitable RF functionality.

The dimensional tolerances of the various holes/openings and of the components are preferably close enough so that on a platen lamination all parts fuse together with no airspace or sinks in the outward appearance of the card.

As shown in the Figures, metal layer 30 has a cut out 36 formed in its top surface. The thickness/depth D1 of cut out 36 is made substantially equal to (i.e. nominally equal to but slightly larger than) the depth of the IC module 7. The hole/opening 36 is machined through metal layer 30 dimensioned to receive module 7, which is secured therein, as by bonding. Module 7 contains a microprocessor chip 7a (internally), a chip antenna 7b and a contact pad 7c. Pad 7c is a conventional contact pad used in contact-type smart cards and is positioned to engage contacts in a card reader when the smartcard is inserted therein.

By design, in the embodiment depicted in FIG. 2, plug 34 is substantially wider than module 7. Preferably, plug 34 extends at least 0.04 laterally beyond either side of module 7. This prevents the metal in substrate 30 from interfering with communication between the card and chip. However, the plug does not have to be wider than module 7 (i.e., its lateral dimensions L2, W2 need not be greater than those of the module L1,W1).

Module 7 is positioned vertically within metal layer 30 so as to provide a contact pad 7c along the top metal surface to realize the contact functions of the dual interface. Moreover, positioning module 7 on plug 34 which is made larger (though not necessarily so) in area than the module 7 makes it possible to decrease interference in the radio communication between module antenna 7b and the booster antenna 47.

Alternatively, cards embodying the invention may be formed as shown in FIGS. 4, 4A, 5A, 5B, 5C and 6. These cards differ from those discussed above in that a plug is formed whose thickness is equal to the thickness of the metal layer. That is, there is no recessed pocket.

Figure 4:
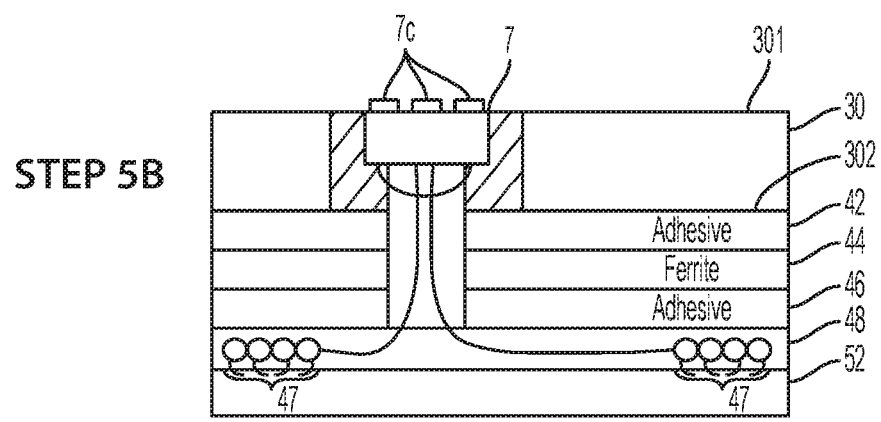
FIG. 4 includes cross sectional diagrams of various processing steps (STEP 1 through STEP 5A or 5B) to form a card according to another aspect of the invention.

As shown in FIG. 4, a card formed in accordance with this aspect of the invention may include the following processing steps and structure:

STEP 1—A metal layer 30 is selected (as shown in STEP 1 of FIG. 4) which is intended to serve as the top layer of a card 10. The metal layer 30 has a top (front) surface 301 and a bottom (back) surface 302 and a thickness (D) which may range from less than 0.01 inches to more than 0.02 inches. Metal layer 30 may have the same characteristics and properties as metal layer 30 shown and discussed above.

STEP 2—A hole 420 of depth D is formed in the metal layer 30 (as shown in step 1 of FIG. 4). The lateral dimensions of the hole are L2 and W2 (see FIGS. 5A and 5B). The hole 420 may be formed in any known manner (e.g., casting or milling). The hole 420 may be a regular or irregular solid cube, or a cylinder whose planar projection in the horizontal plane may be a square, a rectangle or a circle or an irregular shape. In the embodiment shown in FIG. 4, the lateral dimensions [length (L2) and width (W2)] of the hole 420 are respectively greater than the lateral dimensions [length L1 and width W1] of the IC module as further discussed below. Generally, L2 is greater than L1 (by at least 0.04 inches and W2 is greater than W1 (by at least 0.04 inches). However, as noted above, L2 may be made equal to L1, and W2 may be made equal to W1. The advantage of making L2 and W2, respectively, larger than L1 and W1 is to provide greater separation between the metal layer and the IC module and thus enhance RF transmission and reception.

A plug 434 of any material like plug 34 which does not interfere with RF transmission is formed or shaped to conform to the dimensions of the hole 420 to fill the cut out region. Plug 434 is processed and functions to secure the IC module. The interior walls of the hole 420 and/or the exterior walls of the plug 434 is/are coated with a suitable adhesive so the plug 434 adheres firmly to the walls of the hole throughout the processing of the metal layer in the formation of the card. The plug 434 may be made of any thermoplastic material such as PET, PVC or other polymer or any material such as epoxy resins and a ceramic.

STEP 3—An adhesive layer 42 is used to attach a ferrite layer 44 to the back surface 302 of layer 30. An adhesive layer 46 is used to attach a plastic (e.g., PVC) layer 48 which contains and/or on which is mounted a booster antenna 47 to the ferrite layer. Layers 42, 44, 46, and 48 and the booster antenna 47 are formed in a similar manner as the corresponding number components shown in FIG. 2 and serve the same or similar functions. The assembly comprising layers 30, 42, 44, 46 and 48 is laminated to form a card assembly 350.

STEP 4—A T-shaped hole/opening 436 is then formed through the plug 434. The hole 436 is formed by milling, drilling and/or any other suitable means. The top portion 436a of T-shaped hole 436 is formed to have lateral and depth dimensions to accommodate the IC module. Where the dimensions of IC module 7 are L1 by W1 by D1 the top portion of 436a will be formed to be just about L1 by W1 by D1 to enable the IC module to be snugly inserted within the hole 436a and to be glued in place. The bottom portion 436b of the hole 436 formed in plug 434, (by drilling vertically down about the center of the plug 434) extends through the underlying layers 42, 44 and 46 and until layer 48, as shown in STEP 4 of FIG. 4. The lateral dimensions of hole 436b formed in plug 434 are made large enough (a) to enable sufficient RF signals to pass between booster antenna 47 and the IC chip module 7 to enable RF communication to take place reliably in inductively coupled embodiments as depicted in FIG. 4 STEP 5A, and (b) to permit physical connections 500 between the antenna module and the IC module, as depicted in FIG. 4 STEP 5B. The physical connections may take any form, as discussed with respect to the embodiment depicted in FIG. 2 STEP 7B. The lateral dimensions of the hole 436b formed in the plug 434 are denoted as L3 and W3, where L3 and W3 are less than L1 and W1. Note that making L3 and W3 less than L1, and W1, respectively, results in the formation of ledges 438, which will provide support for the IC module and keep it at its designed height of D1 below the top card surface 301. The IC module 7 can be snugly inserted and attached (glued) to the ledges 438 and the top interior walls of the plug 434.

STEPS 5A or 5B—IC module 7 which includes a chip 7a and a chip antenna 7b and a set of contacts 7c is positioned within hole 436a is glued in place. Physical connections extend between the booster antenna 47 and the chip antenna 7b in the embodiment depicted in Step 5B of FIG. 4.

Figure 5A:
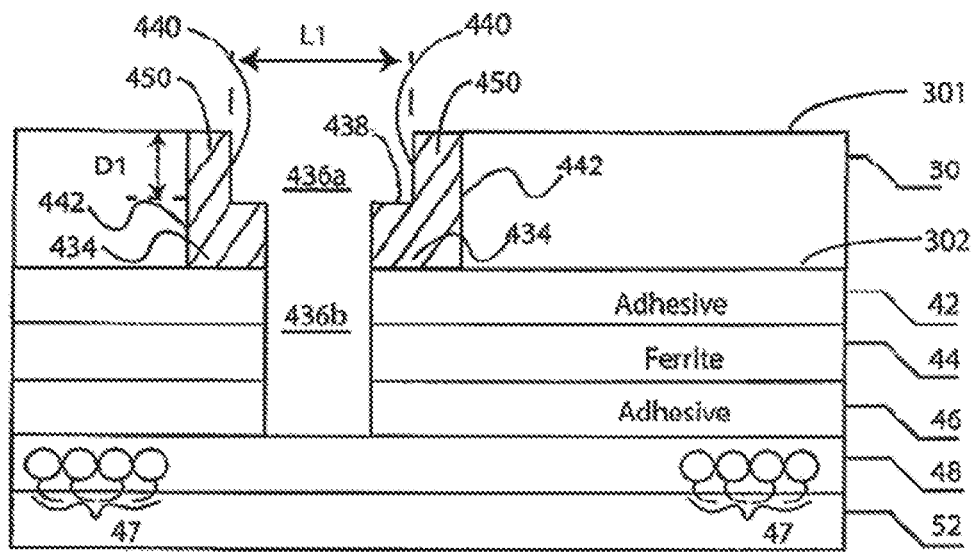
FIG. 5A is a cross sectional diagram corresponding to step 4 of FIG. 4 showing a plug and openings formed in the plug prior to insertion of an IC module.
Figure 5B:
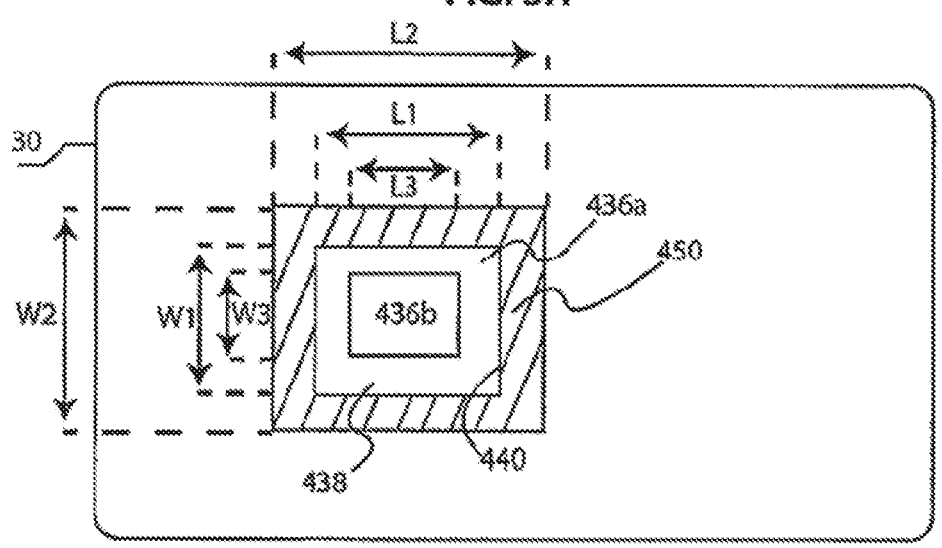
FIG. 5B is a top view of a card having the cross section shown in FIG. 5A showing the plug and openings formed in the plug prior to insertion of an IC module formed in accordance with FIG. 4.
Figure 5C:
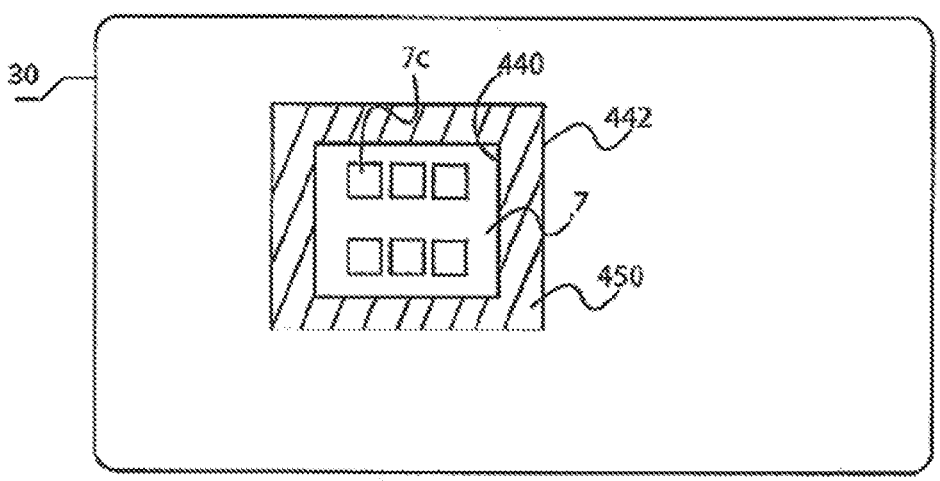
FIG. 5C is a top view of a card formed according to the process steps shown in FIG. 4 and as shown in FIGS. 5A and 5B with an IC module inserted in the opening for the module.
Figure 6:
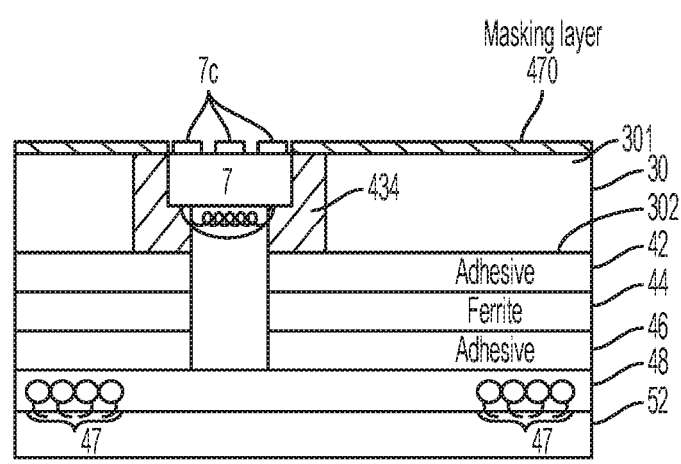
FIG. 6 is a cross-sectional diagram showing a masking layer formed on a card such as the one shown in FIG. 5C.

FIG. 5A (not to be confused with Step 5A of FIG. 4) is an enlarged cross sectional diagram corresponding to step 4 of FIG. 4. FIG. 5B is a top view of a card showing the holes formed in the metal and the plug. FIG. 5C is a top view of a card showing the module 7 mounted and inserted in the top of the card. The smart metal card 10 can function as a wireless (contactless) card or as a contact card. Note that as shown in FIGS. 5A, 5B and 5C the hole portion 436a has an inner edge 440. The plug has an outer edge 442. As is evident from FIGS. 5B and 5C, the IC module 7 will cover openings 436a and 436b. As a result there is a space/area 450 between edges 440 and 442 extending around the outer periphery of the IC module between the module 7 and the metal layer 30. The space/area 450 may be objected to on aesthetic grounds as it detracts from the continuous metal layer (except for the necessary module contact pad). However, it should be appreciated that the space area 450 may enhance RF transmission. The presence of space/area 450 and any depression or bump related to space 450 may be masked by the addition of a masking layer 470, as shown in FIG. 6. Masking layer 470 may comprise any non-metallic layer, such as but not limited to a PVC layer, as is known in the art, or other polymers, such as a polyester composite or polycarbonate, or a very thin ceramic layer. The foregoing construction with a masking layer may be acceptable in many instances. However, in instances where such a solution is still not acceptable or feasible, the solution is to revert to making cards as per the process steps shown in FIG. 2.

Thus, a problem with the smart cards formed in accordance with the process shown in FIG. 4 is that a portion of a plug may be seen. The portion of the plug may mar the continuous appearance of the card and/or as a bump on the surface or as a depression. This may be so, even if a masking (concealing) layer 470 is formed over layer 30.

As taught and discussed with reference to FIG. 2, above, the spacing and any discontinuity in the metal surface (except for the IC module) are avoided by forming a recess pocket 32 in substrate 30 and filling the recess with a plug 34 which is not seen from the top of the card. Thus, in contrast to previous and other dual interface smart metal cards, the plug 34 does not appear as a bump on the surface or as a depression. It is not visible when the card is viewed from the outside. The process of FIG. 2 thus differs from the process of FIG. 4, in which a through hole 420 is formed in the metal layer 30 and a plug 434 fills the hole 420.

In all the embodiments shown above, a plug separates an IC module from a surrounding metal layer and to position and secure the IC module within the card. In inductively coupled designs, the plug also enhances RF transmissivity between the booster antenna and the IC module. In physically connected designs, the plug may also provide operational advantages. Openings for the plug and its positioning within the card are designed to maintain the exterior of the card flat and visually pleasant.

Embodiments with physical connections between the antenna module and the IC antenna may omit inclusion of a plug, however. As shown in FIG. 7, a card formed in accordance with this aspect of the invention may include the following processing steps and structure:

STEP 1—A metal layer 30 is selected, which is intended to serve as the top layer of a card 10. The metal layer 30 has a top (front) surface 301 and a bottom (back) surface 302 and a thickness (D) which may range from less than 0.01 inches to more than 0.02 inches. Metal layer 30 may have the same characteristics and properties as metal layer 30 shown and discussed above. As shown in STEP 1 of FIG. 7, an adhesive layer 42 is used to attach a ferrite layer 44 to the back surface 302 of layer 30. An adhesive layer 46 is used to attach a plastic (e.g., PVC) layer 48 which contains and/or on which is mounted a booster antenna 47 to the ferrite layer. Layers 42, 44, 46, and 48 and the booster antenna 47 are formed in a similar manner as the corresponding number components shown in FIG. 2 and serve the same or similar functions. The assembly comprising layers 30, 42, 44, 46 and 48 is then laminated to form a card assembly 750. A layer 52, which includes a signature panel and a magnetic stripe, may be attached to layer 48 before or after lamination. Layers 42, 44, 46, 48 (and possibly 52) may be formed as a sub-assembly and attached to the bottom side 302 of metal layer 30.

STEP 2—A hole 720 is formed through the metal layer 30 and layers 42, 44, 46, until layer 48. Although shown stopping at layer 48, in some embodiments, the hole may also cut through layer 48 (this is true of the other embodiments described and depicted herein as well). The lateral dimensions of the hole are nominally equal to but slightly larger than the lateral dimensions of the IC module (e.g. L1 and W1). The hole 720 may be formed in any known manner (e.g., milling, drilling and/or any other suitable means). The hole 720 may be a regular or irregular solid cube, or a cylinder whose planar projection in the horizontal plane may be a square, a rectangle or a circle or an irregular shape. The hole may also have a stepped configuration (T-shaped in cross section), with a relatively wider portion facing a top surface and a relatively narrower portion facing a bottom surface of the card, such that the chip when inserted rests on a metal shelf in the card body formed at the transition from the relatively narrower portion to the relatively wider portion. In the embodiment shown in FIG. 7, the lateral dimensions [nominally length (L1) and width (W1)] of the hole 420 are only slightly greater than the lateral dimensions [also nominally length L1 and width W1] of the IC module as discussed herein, in which the difference between the hole and the module dimensions conforms to a commercially acceptable tolerance.

STEP 3—Physical connections 700 are provided between the antenna module and the IC module, as depicted in FIG. 7 STEP 3. The physical connections may take any form, as discussed with respect to the embodiment depicted in FIG. 2 STEP 7, except because hole 720 is not lined by a non-conductive plug, the physical connections may be insulated to avoid shorting against the walls of the hole. In one embodiment, depicted in FIG. 7 STEP 2 ALT A, a liner 760 may be disposed on the sides of the hole, such as with a coating or an annular plug inserted in the hole, prior to making wired connections. Liner 720 may have a length sufficient to cover the entire hole beneath the insertion depth of the IC module to the booster antenna, or it may cover only the metal portion of the hole. In another embodiment, the at least the portion of the physical connections 700b disposed within the portion of the hole in the metal body may be insulated wires (e.g. conductive wires coated with a non-conductive coating). In another embodiment, depicted in FIG. 7 STEP 3, booster antenna layer 48 has connection points 702a for connection to the antenna via connection segments 700a, and the IC module has corresponding connection points 704a. As depicted in FIG. 8, a modular connector 710 has mating connection points 702b and 704b, respectively, for mating with the corresponding connection points in the antenna layer and the IC chip, with electrically conductive connection segments 700b connecting the connection points 702b and 704b within the connector. The lateral dimensions of the connector 710 are also nominally L1 and W1, within essentially the same commercial tolerance as the IC module, to permit snug insertion within the hole 720. The connector may also have an inset with dimensions L3 and W3 less than L1 and W1, respectively, resulting in the formation of ledges 738, which provide support for the IC module and keep it at its designed height of D1 below the top card surface 301. Likewise, in the embodiment depicted in FIG. 7 STEP 2 ALT A, the liner 760 may be sized to provide an equivalent ledge. The IC module 7 can be snugly inserted and attached (glued) to the ledges 738 and the top interior walls of the inset within connector 710. It should be understood that although depicted in connection with this embodiment, a similar connector structure may be employed for any of the other embodiments depicted herein for making physical connections, with the periphery and lateral area of the connector matched to the respective periphery and lateral area of the hole into which it is inserted. In the embodiment depicted in FIG. 7, STEP 3, the body of the connector preferably comprises a non-conductive materials, so as to avoid making any electrical connections between the traces 700b and/or between the traces and the walls of the hole 720 in the metal portion of the card.

As shown in STEP 3 of FIG. 7, IC module 7, which includes a chip 7a and a chip antenna 7b and a set of contacts 7c, is positioned within hole 436. Physical connections 700a,b extend between the booster antenna 47 and the chip antenna 7b.

Although discussed herein in terms of dimensions L1, W1 relative to dimensions L2, W2 relative to dimensions L3, W3 in various places, as noted herein, the invention is not limited to rectangular embodiments, as noted above. Accordingly, when discussed in terms of one element having greater dimensions than another, it should be understood that in non-rectangular embodiments, reference to a structure with relatively larger dimensions refers to a structure having relatively larger area with a relatively larger perimeter located relatively radially outward of the comparative structure, which is also inherently true of the rectangular embodiments referred to in the examples.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A transaction card comprising:
    a metal layer having opposite first and second surfaces and a thickness;
    a first cut out region in the first surface of said metal layer, said first cut out region having a depth less than the thickness of the metal layer;
    an integrated circuit (IC) module having a first portion secured within the first cut out region;
    a second cut out region extending from the first cut out region to the second surface of said metal layer, said second cut out region defining a non-RF-impeding volume and having a perimeter greater than the perimeter of the first cut out region;
    one or more additional layers stacked on the second surface of the metal layer; and
    a channel extending between at least one of the one or more layers and the IC module.

2. The transaction card of claim 1, wherein the perimeter of the second cut out region is disposed symmetrically relative to the perimeter of the first cut out region.

3. The transaction card of claim 1, wherein the one or more additional layers stacked on the second surface of the metal layer includes a booster antenna layer.

4. The transaction card of claim 1, wherein the one or more additional layers stacked on the second surface of the metal layer includes an RF shielding layer.

5. The transaction card of claim 4, wherein the RF shielding layer comprises ferrite.

6. The transaction card of claim 1, wherein the one or more additional layers stacked on the second surface of the metal layer includes an adhesive layer.

7. The transaction card of claim 1, wherein a second portion of the IC module is disposed within the channel.

8. The transaction card of claim 7, wherein the second portion of the IC module disposed within the channel comprises a module antenna.

9. The transaction card of claim 8, wherein the one or more additional layers stacked on the second surface of the metal layer includes a booster antenna layer, and wherein the module antenna is coupled to the booster antenna.

10. The transaction card of claim 9, wherein the module antenna is inductively coupled to the booster antenna layer.

11. The transaction card of claim 9, wherein the module antenna is physically coupled to the booster antenna layer.

12. The transaction card of claim 11, wherein the module antenna is physically coupled to the booster antenna layer via a welded connection.

13. The transaction card of claim 1, wherein the non-RF-impeding volume comprises a plug of non-RF-impeding material secured within said second cut out region.

14. The transaction card of claim 13, wherein the plug has a geometry corresponding to a geometry of the second cut out region.

15. The transaction card of claim 13, wherein the plug comprises PVC.

16. The transaction card of claim 13, wherein a portion of the channel is defined within the plug.

17. The transaction card of claim 16, wherein a second portion of the IC module is disposed within the portion of the channel in the plug, the second portion of the IC module comprising a module antenna.

18. The transaction card of claim 1, wherein the metal layer comprises stainless steel.

19. The transaction card of claim 1, wherein the metal layer and the one or more additional layers stacked on the second surface of the metal layer are laminated to one another.

20. The transaction card of claim 1, wherein the one or more additional layers stacked on the second surface of the metal layer comprise at least one of an adhesive layer, an RF shielding layer, and a booster antenna layer.

21. The transaction card of claim 1, wherein the IC module is a dual-interface IC module.

22. A method of making the transaction card of claim 1, comprising the steps of:
    providing the metal layer, and
    forming the first cut out region, the second cut out region, and the channel by milling processes.

23. The method of claim 22, further comprising:
    securing a plug of non-RF-impeding material within said second cut out region, wherein the process of forming the channel includes milling a portion of the channel in the plug.

24. A transaction card comprising:
    a stainless steel layer having opposite first and second surfaces and a thickness;
    a first cut out region in the first surface of said stainless steel layer, said first cut out region having a depth less than the thickness of the metal layer;
    an integrated circuit (IC) module having a first portion secured within the first cut out region;
    a second cut out region extending from the first cut out region to the second surface of said metal layer, said second cut out region having a perimeter greater than the perimeter of the first cut out region;
    a PVC plug secured within said second cut out region;
    one or more additional layers stacked on the second surface of the metal layer, the one or more layers comprising at least one adhesive layer, an RF shielding layer, and a booster antenna layer containing a booster antenna; and
    a channel formed in the plug extending between at least one of the one or more layers and the IC module, wherein a module antenna portion of the IC module is disposed within the channel and physically coupled to the booster antenna.

* * * * *